United States Patent
Lee et al.

(10) Patent No.: US 9,899,972 B2
(45) Date of Patent: Feb. 20, 2018

(54) SWITCHING AMPLIFIER, SOUND OUTPUT DEVICE, AND AUDIO APPARATUS USING THE SAME

(71) Applicant: SAMSUNG ELECTRONICS CO., LTD., Suwon-si (KR)

(72) Inventors: Jae-cheol Lee, Yongin-si (KR); Kee-yeong Cho, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 315 days.

(21) Appl. No.: 14/453,694

(22) Filed: Aug. 7, 2014

(65) Prior Publication Data
US 2015/0188502 A1    Jul. 2, 2015

(30) Foreign Application Priority Data
Jan. 2, 2014   (KR) .................. 10-2014-0000073

(51) Int. Cl.
*H03F 3/217* (2006.01)
*H03F 3/185* (2006.01)

(52) U.S. Cl.
CPC ........... *H03F 3/2173* (2013.01); *H03F 3/185* (2013.01); *H03F 2200/03* (2013.01); *H03F 2200/405* (2013.01)

(58) Field of Classification Search
CPC ...................................... H03F 3/217
USPC ............................. 330/251, 207 A
See application file for complete search history.

(56) References Cited

U.S. PATENT DOCUMENTS

| | | | | |
|---|---|---|---|---|
| 5,767,740 A | * | 6/1998 | Fogg | H03F 3/2173 330/10 |
| 6,420,930 B1 | * | 7/2002 | Takagishi | H03F 3/2171 330/207 A |
| 6,483,281 B2 | * | 11/2002 | Hwang | H02M 3/158 323/299 |
| 7,076,070 B2 | * | 7/2006 | Pearce | H01L 21/8234 257/368 |
| 7,528,651 B2 | * | 5/2009 | Honda | H03F 1/26 330/10 |
| 2003/0194970 A1 | * | 10/2003 | Hoyt | H03F 1/0261 455/63.1 |
| 2010/0231297 A1 | * | 9/2010 | Buitendijk | H03F 1/26 330/251 |
| 2013/0057331 A1 | * | 3/2013 | Yuan | H04R 3/04 327/341 |

* cited by examiner

*Primary Examiner* — Henry Choe
(74) *Attorney, Agent, or Firm* — Sughrue Mion, PLLC

(57) ABSTRACT

A switching amplifier is provided. The switching amplifier includes an input unit configured to receive an audio signal, a first switching element and a second switching element configured to switch and output the received audio signal, a first regulator configured to vary and provide a voltage input to the first switching element so that the first switching element is not turned on in an operation area of the second switching element, and a second regulator configured to vary and provide a voltage input to the second switching element so that the second switching element is not turned on in an operation area of the first switching element. In addition, the first switching element and the second switching element are a depletion type transistor.

18 Claims, 5 Drawing Sheets

SWITCHING AMPLIFIER, SOUND OUTPUT DEVICE, AND AUDIO APPARATUS USING THE SAME

CROSS-REFERENCE TO RELATED APPLICATIONS

This application claims priority under 35 U.S.C. § 119 from Korean Patent Application No. 10-2014-0000073, filed on Jan. 2, 2014 in the Korean Intellectual Property Office, the disclosure of which is incorporated herein by reference in its entirety.

BACKGROUND

1. Field of the Invention

The general inventive concept relates to a switching amplifier and an audio apparatus including the same, and more particularly, to a switching amplifier which is capable of operating an amplifier consisting of depletion-type transistors by using a single power port and an audio apparatus including the same.

2. Description of the Related Art

An audio apparatus refers to an apparatus which outputs an audio signal recorded in a form of an electrical signal, and includes an amplifier for amplifying the audio signal. Such amplifier includes a transistor for amplifying the audio signal, and is divided into various types according to a type and arrangement of the transistor.

In the related art, a P-N type switching amplifier where a P-type transistor is arranged on an upper side and an N-type transistor is arranged in a lower side and an N-N type switching amplifier where N-type transistors are arranged on both sides have been commonly used.

Such P-N type switching amplifier and N-N type switching amplifier are not turned on when a Vgs of each of the transistors is 0V, and thus, do not cause any problem even though two transistors are connected by a single power port. To be specific, there is no possibility that two transistors are turned on simultaneously even though two transistors are connected in series, and thus, it is possible to operate two transistors by a single power port.

Recently, in order to improve performance, a gallium nitride (GaN) transistor which is turned on even when a Vgs voltage is 0V is used to embody a switching amplifier. However, the GaN transistor may operate even when the Vgs voltage is 0V, and thus, when a switching amplifier is formed of a circuit which is the same as an existing circuit, two transistors may be turned on simultaneously. As the result, there has been a problem that a positive (+) power terminal and a negative (−) power terminal are shorted out when the GaN transistors connected in series are turned on simultaneously.

SUMMARY

The present disclosure has been provided to address the aforementioned and other problems and disadvantages occurring in the related art, and an aspect of the present disclosure provides a switching amplifier which is capable of operating an amplifier consisting of depletion-type transistors by using a single a power port and an audio apparatus including the same.

A switching amplifier according to an exemplary embodiment includes an input unit configured to receive an audio signal, a first switching element and a second switching element configured to switch and output the received audio signal, a first regulator configured to vary and provide a voltage input to the first switching element so that the first switching element is not turned on in an operation area of the second switching element, and a second regulator configured to vary and provide a voltage input to the second switching element so that the second switching element is not turned on in an operation area of the first switching element. In addition, the first switching element and the second switching element are a depletion type transistor.

In this case, the first regulator may provide a gate of the first switching element with a negative voltage of a predetermined level in the operation area of the second switching element. In addition, the second regulator may provide a gate of the second switching element with a negative voltage of a predetermined level in the operation area of the first switching element.

Meanwhile, the input unit may include a buffer configured to delay and output the received audio signal and an inverter configured to reverse and output the received audio signal. In addition, the first regulator may include a third switching element configured to have a gate connected to an output terminal of the buffer, a drain multi-connected to a source of the first switching element and a drain of the second switching element, and a source connected to the gate of the first switching element, a fourth switching element configured to have a gate connected to an output terminal of the inverter and a drain multi-connected to a source of the third switching element and the gate of the first switching element, a first capacitor configured to have one end multi-connected to a drain of the third switching element and the source of the first switching element, and the other end connected to a source of the fourth switching element, a first power unit configured to have a predetermined potential and both ends connected to the source of the first switching element, a first resistor configured to have one end connected to a cathode of the first power unit, and a first diode configured to have a cathode connected to the other end of the first resistor and an anode multi-connected to the other end of the first capacitor and the source of the fourth switching element.

The second regulator may include a fifth switching element configured to have a gate connected to the output terminal of the inverter and a drain connected to the source of the second switching element, a sixth switching element configured to have a gate connected to the output terminal of the buffer and a drain connected to the gate of the second switching element, a second power unit configured to have a predetermined potential and an anode multi-connected to the source of the second switching element and the drain of the fifth switching element, a second resistor configured to have one end multi-connected to the source of the fourth switching element and the other end of the first capacitor, and a second diode configured to, in response to a cathode being multi-connected to the drain of the fifth switching element and the anode of the second power unit, have a drain connected to the other end of the second resistor.

Meanwhile, the switching amplifier may further include a seventh switching element and a eighth switching element configured to cut off power unit to the first switching element and the second switching element before a predetermined condition is satisfied in an initial driving of the switching amplifier.

The first switching element and the second switching element may be gallium nitride (GaN) transistors.

The switching amplifier may further include an LC circuit being multi-connected the first switching element and the second switching element.

A sound output device according to an exemplary embodiment includes a communication interface configured to receive audio content, an audio processor configured to divide the audio content into a plurality of audio signals, and a plurality of switching amplifiers configured to switch each of the divided audio signals by using two switching elements connected in series, the switching elements being a depletion type transistor, and provide a speaker with the switched audio signals. In addition, each of the plurality of switching amplifiers may provide a gate of each switching element with a predetermined negative voltage in a section which is not an operation area of a switching element.

Each of the plurality of switching amplifiers may include an input unit configured to receive the divided audio signals, a first switching element and a second switching element configured to switch and output the received audio signals, a first regulator configured to vary and provide a voltage input to the first switching element so that the first switching element is not turned on in the operation area of the second switching element, and a second regulator configured to vary and provide a voltage input to the second switching element so that the second switching element is not turned on in the operation area of the first switching element.

In this case, the first regulator may provide a gate of the first switching element with a negative voltage of a predetermined level in the operation area of the second switching element. In addition, the second regulator may provide a gate of the second switching element with a negative voltage of a predetermined level in the operation area of the first switching element.

The input unit may include a buffer configured to delay and output the received audio signals and an inverter configured to reverse and output the received audio signals. In addition, the first regulator may include a third switching element configured to have a gate connected to an output terminal of the buffer, a drain multi-connected to a source of the first switching element and a drain of the second switching element, and a source connected to the gate of the first switching element, a fourth switching element configured to have a gate connected to an output terminal of the inverter and a drain multi-connected to the source of the third switching element and the gate of the first switching element, a first capacitor configured to have one end multi-connected to the drain of the third switching element and the source of the first switching element and the other end connected to a source of the fourth switching element, a first power unit configured to have a predetermined potential and an anode connected to the source of the first switching element, a first resistor configured to have one end connected to a cathode of the first power unit, and a first diode configured to have a cathode connected to the other end of the first resistor and an anode multi-connected to the other end of the first capacitor and the source of the fourth switching element.

Meanwhile, the second regulator may include a fifth switching element configured to have a gate connected to the output terminal of the inverter and a drain connected to the source of the second switching element, a sixth switching element configured to have a gate connected to the output terminal of the buffer and a drain connected to the gate of the second switching element, a second power unit configured to have a predetermined potential and an anode multi-connected to the source of the second switching element and the drain of the fifth switching element, a second resistor configured to have one end multi-connected to the source of the fourth switching element and the other end of the first capacitor, and a second diode configured to, in response to a cathode multi-connected to the drain of the fifth switching element and the anode of the second power unit, have a drain connected to the other end of the second resistor.

Each of the plurality of switching amplifiers may further include a seventh switching element and an eighth switching element configured to cut off power unit to the first switching element and the second switching element before a predetermined condition is satisfied in an initial driving of the switching amplifier.

The first switching element and the second switching element may be gallium nitride (GaN) transistors.

Each of the plurality of switching amplifiers may further include an LC circuit multi-connected the first switching element and the second switching element.

BRIEF DESCRIPTION OF THE DRAWINGS

The above and/or other aspects of the inventive concept will be more apparent by describing certain exemplary embodiments of the inventive concept with reference to the accompanying drawings, in which.

DETAILED DESCRIPTION

Figure 1:
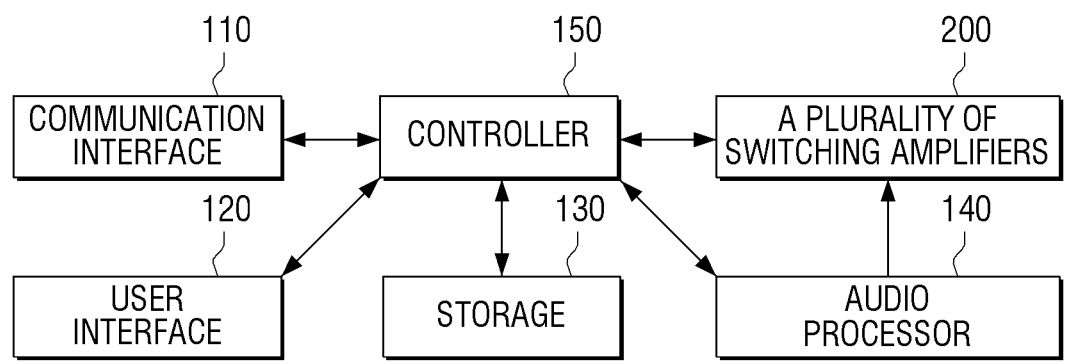
FIG. 1 is a block diagram illustrating a structure of an audio apparatus according to an exemplary embodiment.

Certain exemplary embodiments are described in greater detail below with reference to the accompanying drawings.

In the following description, like drawing reference numerals are used for the like elements, even in different drawings. The matters defined in the description, such as detailed construction and elements, are provided to assist in a comprehensive understanding of exemplary embodiments. However, exemplary embodiments can be practiced without those specifically defined matters. Also, well-known functions or constructions are not described in detail since they would obscure the application with unnecessary detail.

FIG. 1 is a block diagram illustrating a structure of an audio apparatus according to an exemplary embodiment.

Referring to FIG. 1, an audio apparatus 100 includes a communication interface 110, a user interface 120, a storage 130, an audio processor 140, a controller 150, and a plurality of switching amplifiers 200. Herein, the audio apparatus 100 may be an electronic apparatus which is provided with a speaker or provides an audio signal to a speaker. That is, the audio apparatus 100 may be a Home Theater System (HTS), a television (TV), a digital TV, a settop box, a radio, a headset, an MP3 player, a Portable Multimedia Player (PMP), a personal computer, a notebook PC, etc.

The communication interface 110 may be formed to be connected to at least one external apparatus (for example, a computer, a TV, a settop box, a digital satellite broadcast receiver, a video tape recorder (VTR)), and may receive audio content from the external apparatus. Herein, the audio content may be content including at least one or more audio signals, and may be analogue content or digital content. In this case, the audio signal is an electrical signal with respect to a sound wave channel.

The user interface 120 may include a plurality of function keys which enables a user to set or select various functions supported by the audio apparatus 100, and display various pieces of information provided by the audio apparatus 100. The user interface 120 may be implemented as an apparatus where an input function and an output function are performed simultaneously like a touch screen, or may be implemented as a combination of an input device such as a mouse or keyboard and a plurality of display apparatuses such as a Light Emitting Diode (LED) and a Liquid Crystal Display (LCD). The user is able to control a volume of a provided sound by using the user interface 120.

The storage 130 may store audio content received through the communication interface 110. When the received audio content is analogue content, the storage 130 may convert and store the analogue content into digital content. Meanwhile, the storage 130 may be implemented as a hard disk, a non-volatile memory, a volatile memory, etc.

The audio processor 140 performs signal processing such as audio decoding with respect to the audio content inputor stored in the storage 130.

In addition, the audio processor 140 divides the audio content for which the signal processing is performed into a plurality of audio signals. For example, when the audio content is a stereo audio signal, the audio processor 140 may divide the stereo audio signal into a left audio signal and a right audio signal. When the audio content is 2.1 channel audio content, the audio processor 140 may divide the 2.1 channel audio content into a left audio signal, a right audio signal, and a woofer audio signal. When the audio content is 5.1 channel audio content, the audio processor 140 may divide the 5.1 channel audio content into a left front audio signal, a right front audio signal, a left rear audio signal, a right rear audio signal, and a woofer audio signal.

In addition, the audio processor 140 may transmit the divided audio signals to the corresponding switching amplifier 200. To be specific, a switching amplifier is connected to a particular speaker, and thus, it is possible to transmit an audio signal corresponding to the particular speaker to the switching amplifier 200 which is connected to the speaker. For example, when the audio processor 140 divides the stereo audio content into a left audio signal and a right audio signal, the audio processor 140 may transmit the left audio signal to a switching amplifier which is connected to a left speaker and transmit the right audio signal to a switching amplifier which is connected to a right speaker.

The plurality of switching amplifiers 200 switch each of the divided audio signals, and output the switched audio signals through a connected speaker. To be specific, each of the switching amplifiers 200 switches the input audio signals by using two depletion type transistors and transmits the switched audio signals to the connected speaker. In this case, each of the switching amplifiers 200 includes a regulator which supplies a predetermined negative voltage to a gate of each switching element in a section that is not an operation area of the switching element. Specific structure and operation of the switching amplifier 200 will be described below with reference to FIG. 2.

The controller 150 may control each component included in the audio apparatus 100. To be specific, when the audio content is received through the communication interface 110, the controller 150 may control the audio processor 140 to divide the received audio content into a plurality of audio signals, and control the plurality of switching amplifiers 200 to amplify and transmit the divided audio signals to the speaker.

As described above, the audio apparatus 100 according to the exemplary embodiment includes a regulator which supplies a predetermined negative voltage to a gate of each switching element in a section that is not an operation area of the switching element, and thus, may operate even though power of the power unit is applied simultaneously through a single port.

Meanwhile, in connection with FIG. 1, although it was described that a switching amplifier processes a channel (that is, an audio signal), a switching amplifier may process a plurality of channels.

Figure 2:
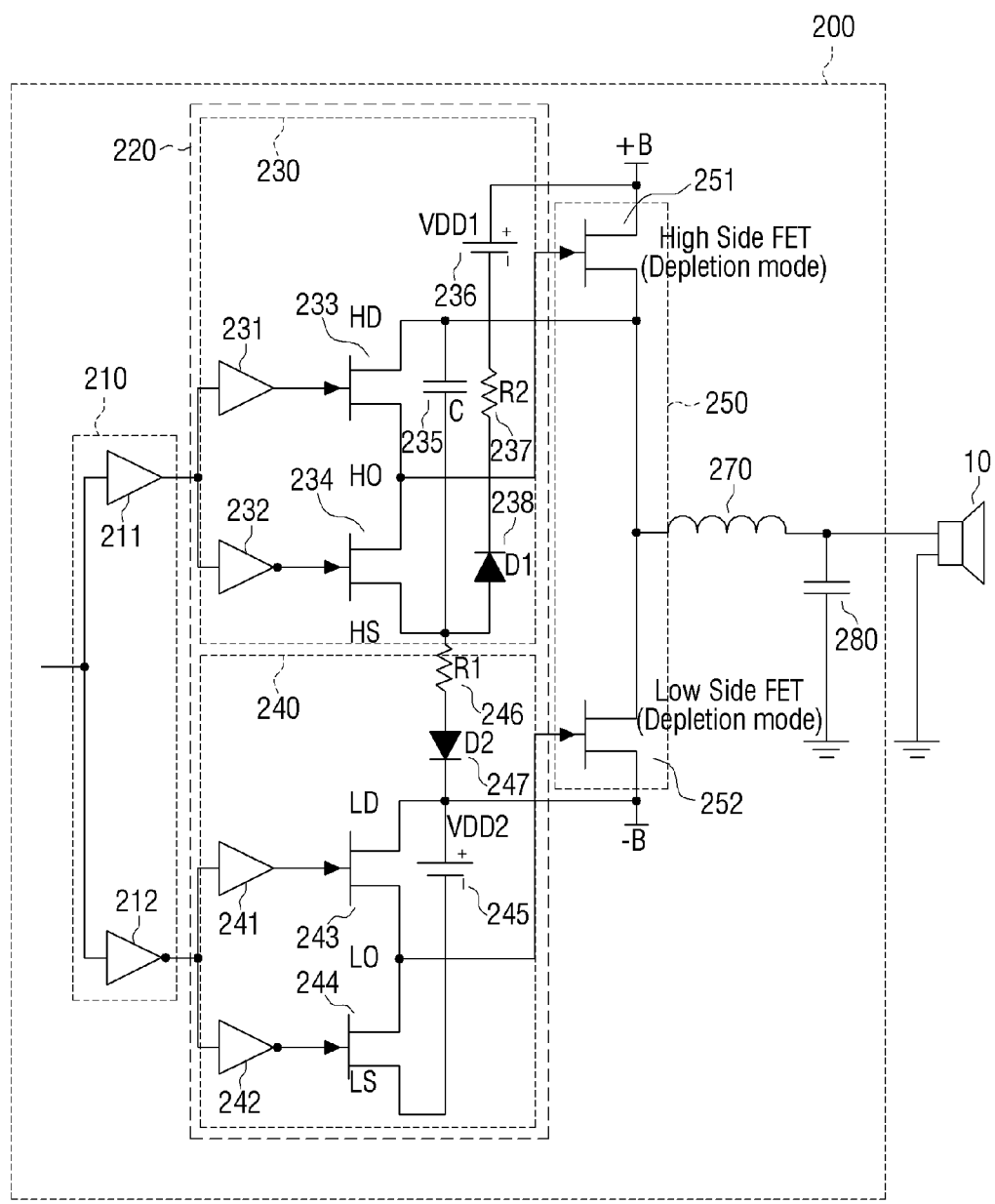
FIG. 2 is a circuit diagram illustrating a specific structure of the switching amplifier of FIG. 1.

FIG. 2 is a circuit diagram illustrating a specific structure of the switching amplifier of FIG. 1.

Referring to FIG. 2, the switching amplifier 200 may include an input unit 210, a regulator 220, a plurality of switching elements 250, and LC circuit components 270 and 280.

The input unit 210 receives an audio signal. To be specific, the input unit 210 may include a first buffer 211 and a first inverter 212.

The first buffer 211 delays an input audio signal and outputs the delayed audio signal to an input terminal of a first regulator 230.

The first inverter 212 reverses the input audio signal and outputs the reversed audio signal to an input terminal of a second regulator 240.

The regulator 220 supplies a predetermined negative voltage to a gate of each switching element so that each of the plurality of switching elements 250 is not turned on in a section that is not an operation area of the switching element. To be specific, the regulator 220 includes the first regulator 230 and the second regulator 240.

The first regulator 230 varies and provides a voltage to be input to a first switching element 251 so that the first switching element 251 is not turned on in an operation area (to be specific, a turn-on area) of a second switching element 252. To be specific, the first regulator 230 may supply a negative voltage of a predetermined level to the gate of the first switching element 251 in the turn-on area of the second switching element 252 so that the first switching element 251 is not turned on in the turn-on area of the second switching element 252. The first regulator 230 may include a second buffer 231, a second inverter 232, a third switching element 233, a fourth switching element 234, a capacitor 235, a first power unit 236, a first register 237, and a first diode 238.

The second buffer 231 delays a signal outputted from the first buffer 211 and outputs the delayed signal to a gate of the third switching element 233.

The second inverter 232 reverses the signal outputted from the first buffer 211 and outputs the reversed signal to a gate of the fourth switching element 234.

The third switching element 233 may include a gate connected to an output terminal of the second buffer 231, a drain multi-connected to a source of the first switching element 251, one end of the first capacitor 235, and a drain of the second switching element 252, and a source multi-connected to a drain of the fourth switching element 234 and the gate of the first switching element 251.

The fourth switching element 234 may include a gate connected to an output terminal of the second inverter 232 and a drain multi-connected to the source of the third switching element 233 and the gate of the first switching element 251, and a source multi-connected to the other end of the first capacitor 235, an anode of the first diode 238, and one end of the second resistor 246.

The first capacitor 235 may include one end connected to the drain of the third switching element 233, the source of the first switching element 251, and the drain of the second switching element 252, and the other end multi-connected to the source of the fourth switching element 234, the anode of the first diode 238, and one end of the first resistor 246.

The first power unit 236 (VDD1) has a predetermined voltage value, and may include an anode multi-connected to the drain of the first switching element 251 and a first power terminal (+B) and a cathode connected to one end of the first resistor 237. In this case, the predetermined voltage value refers to a voltage which is sufficient to turn on/off the first switching element 251.

The second resistor 237 may include one end connected to a cathode of the first power unit 236 and the other end connected to a cathode of the first diode 238.

The first diode 238 may include the cathode connected to the other end of the second resistor 237 and the anode multi-connected to the source of the fourth switching element 234, the other end of the first capacitor 235, and one end of the first resistor 246.

The second regulator 240 varies and provides a gate voltage to be input to the second switching element 252 so that the second switching element 252 is not turned on in the operation area of the first switching element 251. To be specific, the second regulator 240 may supply a negative voltage of a predetermined level to the gate of the second switching element 252 in the turn-on are of the first switching element 251 so that the second switching element 252 is not turned on in the turn-on area of the first switching element 251. The second regulator 240 may include a third buffer 241, a third inverter 242, a fifth switching element 243, a sixth switching element 244, a second power unit 245, a second register 246, and a second diode 247.

The third buffer 241 delays a signal outputted from the first inverter 212 and outputs the delayed signal to a gate of the fifth switching element 243.

The third inverter 242 reverses a signal outputted from the first inverter 212 and outputs the reversed signal to a gate of the sixth switching element 244.

The fifth switching element 243 may include the gate connected to an output terminal of the third buffer 241, a drain multi-connected to the source of the second switching element 252, the second power terminal (−B), an anode of the second power unit 245, and the cathode of the second diode 247.

The sixth switching element 244 may include a gate connected to an output terminal of the third inverter 242, a drain multi-connected to the source of the fifth switching element 243 and the gate of the second switching element 252, and a source connected to a cathode of the second power unit 245.

The second power unit 245 (VDD2) has a predetermined voltage value, and may include an anode multi-connected to the drain of the fifth switching element 243, the source of the second switching element 252, the second power terminal (−B), and the cathode of the second diode 247, and the cathode connected to the source of the sixth switching element 244. In this case, the predetermined voltage value refers to a voltage which is sufficient to turn on/off the second switching element 252. By the second power unit 245, the second switching element 252 may be turned on/off, and a source potential (LO) of the fifth switching element 243 (or a drain potential of the sixth switching element 244) and a drain potential (LD) of the fifth switching element 244 maintain a negative (−) potential at all times.

The first resistor 246 may include one end multi-connected to the source of the fourth switching element 234, the other end of the first capacitor 235, and the anode of the first diode 238, and the other end connected to the anode of the second diode 247.

The second diode 247 may include the anode connected to the other end of the first resistor 246 and the cathode multi-connected to the drain of the fifth switching element 243, the anode of the second power unit 245, the source of the second switching element 252, and the second power terminal (−B).

The plurality of switching elements 250 are connected in series, and switch and output an inputaudio signal. The plurality of switching elements 250 may include the first switching element 251 and the second switching element 252.

The first switching element 251 is a depletion type transistor, and includes the gate multi-connected to the source of the third switching element 233 and the drain of the fourth switching element 234, the drain multi-connected to the first power terminal (+B) and the anode of the first power unit 236, and the source multi-connected to the drain of the third switching element 233, one end of the first capacitor 235, and one end of a RC circuit (to be specific, one end of an inductor 270).

The second switching element 252 is a depletion type transistor, and includes the gate multi-connected to the source of the fifth switching element 243 and the drain of the sixth switching element 244, the drain multi-connected to the source of first switching element 251, the drain of the third switching element 233, one end of the first capacitor 235, and one end of the RC circuit (to be specific, one end of the inductor 270), and the source multi-connected to the drain of the fifth switching element, the cathode of the second diode 247, the anode of the second power unit 245, and the second power terminal (−B).

The power terminals (+B, −B) supply a predetermined power to the first switching element 251 and the second switching element 252, respectively. To be specific, the plurality of power terminals (+B, −B) may include the first power terminal (+B) and the second power terminal (−B).

Figure 5:
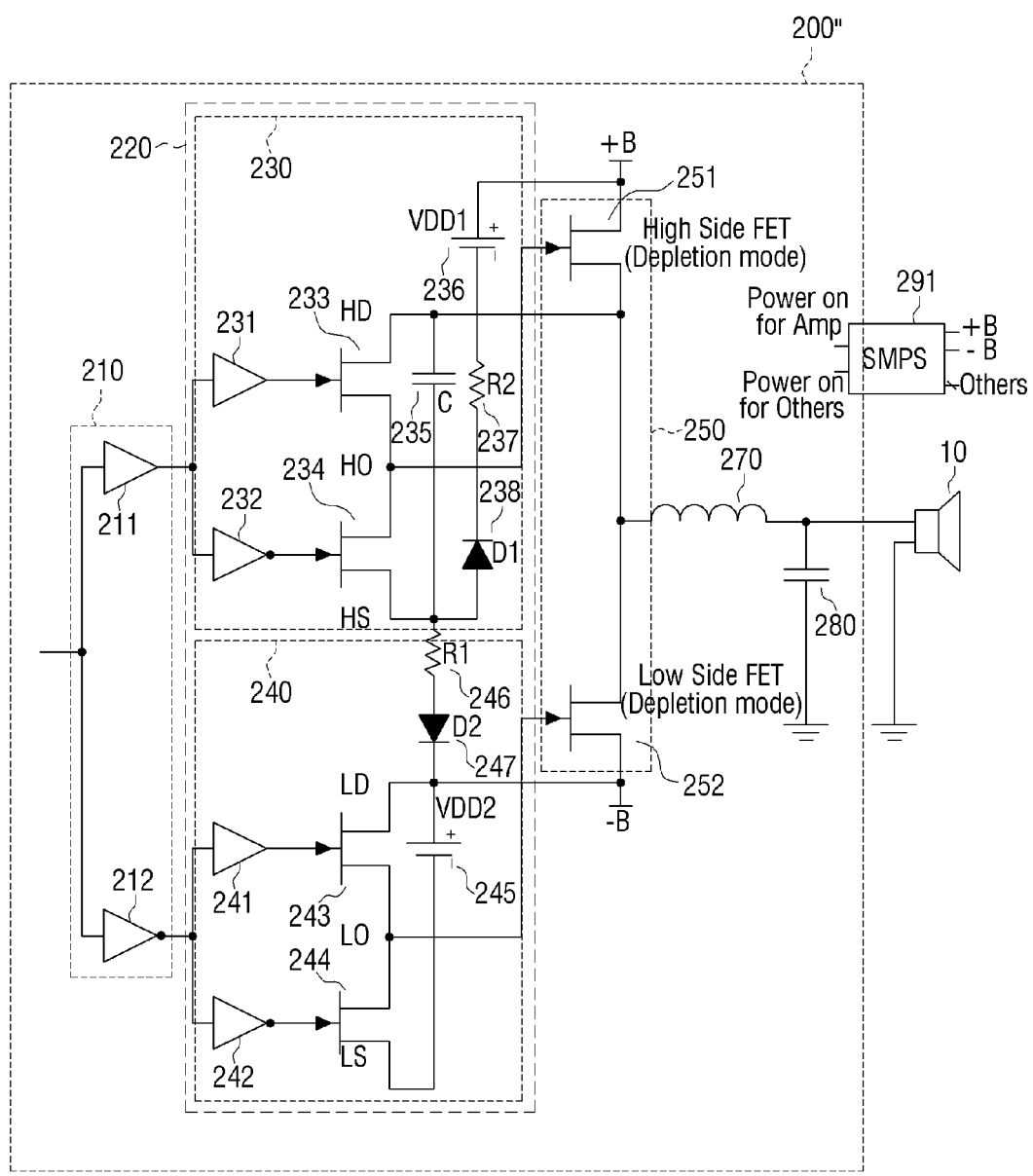

The first power terminal (+B) supplies a positive power to the first switching element 251. The positive power of the first power terminal (+B) may be input after the first switching element 251 and the second switching element are initialized. That is, in order to prevent an initial short, the positive power of the first power terminal (+B) may be inputafter a predetermined negative voltage is applied to the gate of the first switching element 251. In order to perform such function, the first power terminal (+B) may be equipped with an additional transistor 261 as illustrated in FIG. 5, or may be additionally controlled by a switching mode power supply (SMPS) as illustrated in FIG. 6. Such operations will be described below with reference to FIGS. 5 and 6.

The second power terminal (−B) supplies a negative power to the second switching element 252. The negative power of the second power terminal (−B) may be input after the first switching element 251 and the second switching element are initialized. That is, in order to prevent an initial short, the negative power of the second power terminal (−B) may be input after a predetermined negative voltage is applied to the gate of the second switching element 252. In order to perform such function, the second power terminal (−B) may be equipped with an additional transistor 262 as illustrated in FIG. 5, or may be additionally controlled by the switching mode power supply (SMPS) as illustrated in FIG. 6. Such operations will be described below with reference to FIGS. 5 and 6.

The LC circuit components 270 and 280 are multi-connected to the first switching element 251 and the second switching element 252. The LC circuit components 270 and 280 may include the inductor 270 and the second capacitor 280.

The inductor 270 includes one end multi-connected to the source of the first switching element 251 and the drain of the second switching element 252 and the other end multi-connected to one end of a speaker 10 and one end of the second capacitor 280.

The second capacitor 280 includes one end multi-connected to the other end of the inductor 270 and one end of the speaker 10, and the other end connected to a ground.

In connection with FIG. 2, although it was described that the speaker 10 is disposed outside of the switching amplifier, the speaker 10 may be embedded within the switching amplifier 200.

In addition, in connection with FIG. 2, although only an example of using an element such as GaN as a switching element, a transistor which is operable in a manner of the depletion type may use a transistor of other type.

Meanwhile, in the illustrated example, although the regulators 230 and 240 include a buffer and an inverter respectively, the second buffer 231, the second inverter 232, the third buffer 241, and the third inverter 242 may be omitted, the output of the first buffer 231 may be directly connected to the gate of the third switching element 233 and the gate of the sixth switching element 244, and the output of the first inverter 212 may be connected to the gate of the fourth switching element 234 and the gate of the fifth switching element 243, in implementation.

Hereinafter, an operation of the switching amplifier of FIG. 2 is described with reference to FIG. 3.

Figure 3:
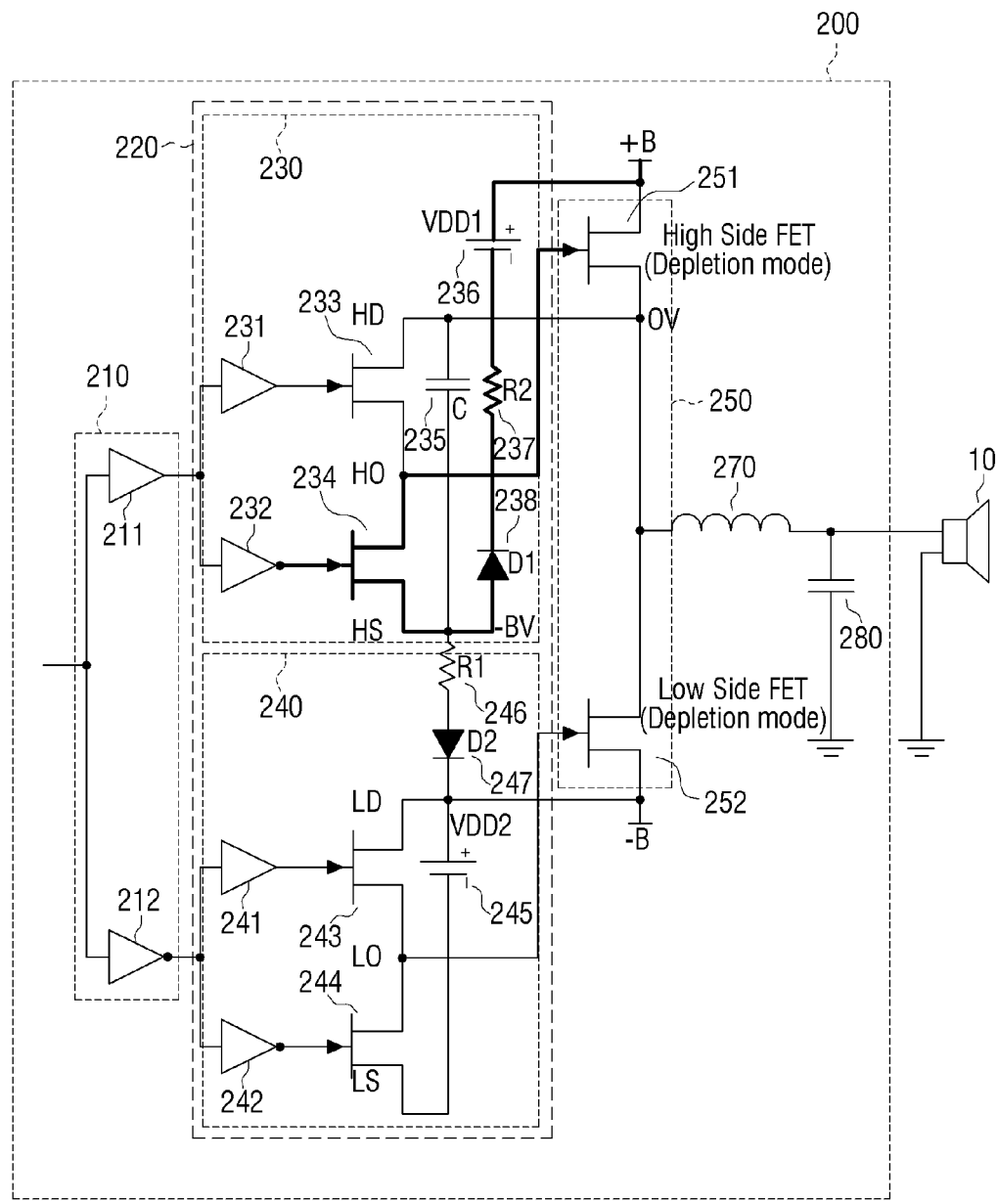
FIG. 3 is a circuit diagram illustrating an initial driving operation of the switching amplifier of FIG. 2.

FIG. 3 is a circuit diagram illustrating an initial driving operation of the switching amplifier of FIG. 2.

Referring to FIG. 3, by the second power unit 245, the second switching element 252 may be turned on/off, and the source potential (LO) of the fifth switching element 243 (or the drain potential of the sixth switching element 244) and the drain potential (LD) of the fifth switching element 244 may maintain a negative (−) potential at all times.

However, the source of the first switching element 251 floats, and thus, a switching method of the first switching element 251 may vary depending upon a potential of the source of the first switching element 251.

When the first switching element 251 is initially driven, the source of the first switching element 251 is connected to the drain (HD) of the third switching element 233, and an initial state power is 0V. In this case, a source potential (HS) of the fourth switching element 234 becomes −BV through the second diode 247.

A potential difference between the drain potential (HD) OF the third switching element 233 and the source potential (HS) of the fourth switching element 234 becomes −B, and thud, the first switching element 251 may be turned on/off in the initial status.

In the initial status, when a signal of '0' is received, the second inverter 242 outputs a signal of '1', and the fourth switching element 232 is turned on. When the fourth switching element 232 is turned on, −B is applied to the drain (HO) of the fourth switching element 232, the Vgs of the first switching element becomes a negative (−) voltage, and thus, the first switching element 251 is turned on.

When the first switching element 251 is turned on, the drain potential (HD) of the third switching element 233 becomes +B, the source potential of the fourth switching element 234 becomes +B−VDD1 through the first diode 238, and the potential difference between HD and HS becomes VDD1.

Subsequently, when the second switching element 252 is turned on, the drain potential of the third switching element 233 becomes −B, and the source potential of the fourth switching element 234 becomes −B−VDD1. The source potential −B−VDD1 is lower than the drain potential (LD) −B of the fifth switching element 241, and thus, the potential is maintained by D2.

Figure 4:
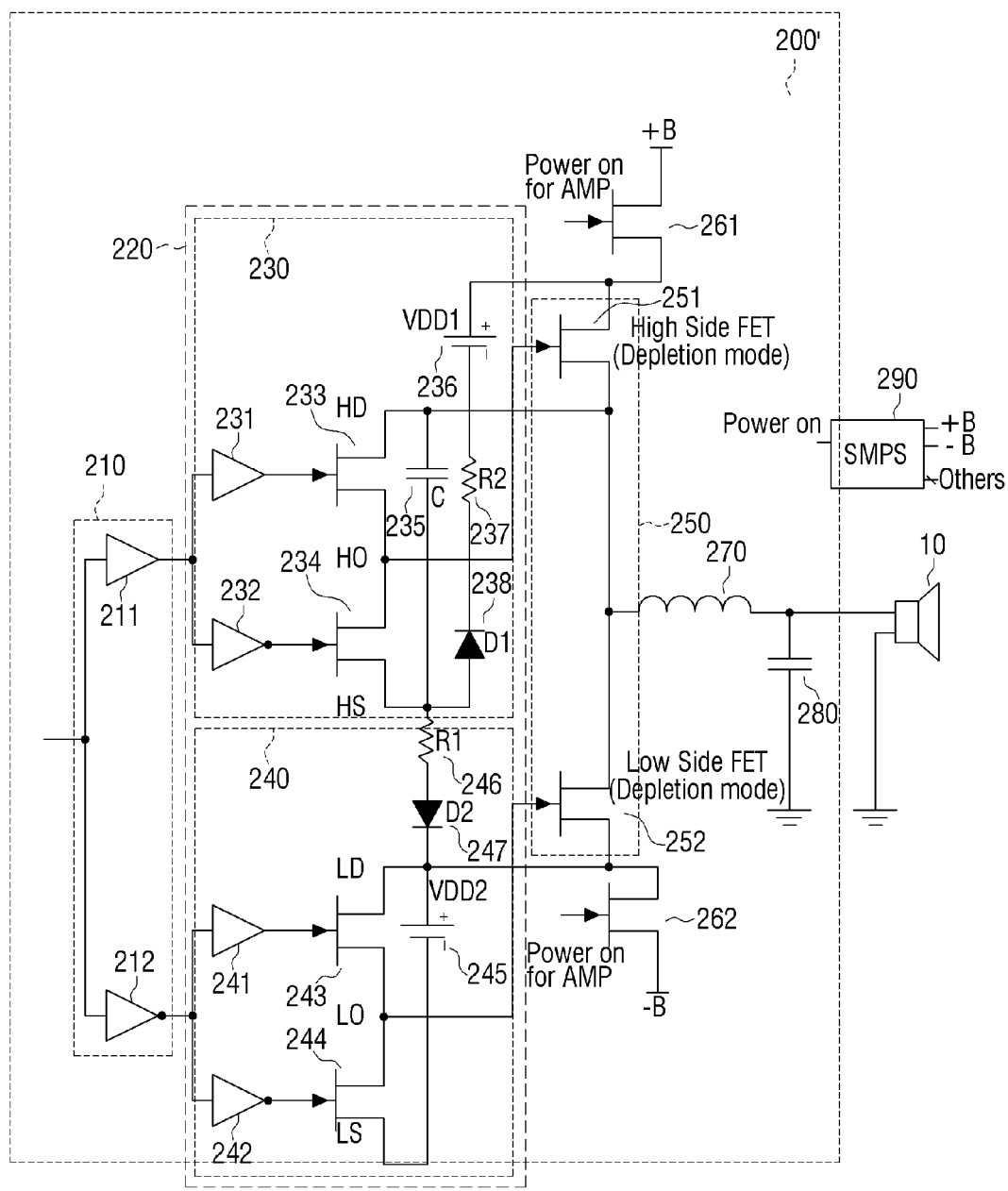
FIGS. 4 and 5 are diagrams provided to describe a method for supplying power of the switching amplifier of FIG. 2.

FIGS. 4 and 5 are diagrams provided to describe a method for supplying power of the switching amplifier of FIG. 2.

The depletion type transistor has a characteristic of being turned off only when a negative voltage is applied to Vgs. When power is applied to the transistor before the negative voltage is applied to Vgs, both upper transistor 251 and lower transistor 252 are turned on, and thus, the short occurs. Accordingly, for a stable initial operation of the switching amplifier, the power may be supplied only when the negative voltage is applied to Vgs of at least one of the upper transistor and lower transistor.

To be specific, FIG. 4 is provided to describe a method for controlling power supplied to the first switching element and the second switching element by using additional switching elements 261 and 262, and FIG. 5 is provided to describe a method for controlling an output of an external power supply apparatus (SMPS).

Referring to FIG. 4, the drain of the first switching element 251 is connected to the first power terminal (+B) through a seventh switching element 261. The source of the second switching element 252 is connected to the second power terminal (−B) through an eighth switching element 262.

The seventh switching element 261 and the eight switching element 262 may not supply the power of the power terminals before a negative (−) potential of a predetermined level is input to a gate of one of the first switching element and the second switching element (that is, after the initial driving), and may supply the power when the initialization is completed.

In addition, referring to FIG. 5, the power supply apparatus (291, SMPS) may selectively output the power which is supplied to the first switching element and the second switching element according to an external control signal. To be specific, the SMPS 291 may not supply the power to the first switching element 251 and the second switching element 252 before a negative (−) voltage of a predetermined level is input to a gate of one of the first switching element and the second switching element (that is, after the initial driving) according to the external control signal, and may supply the power to the first switching element 251 and the second switching element 252 when a system is initialized.

As given above, although a few desirable exemplary embodiments have been shown and described, the disclosure is not limited to the aforementioned particular exemplary embodiments, and could be variously modified and achieved by those skilled in the art to which the disclosure pertains without deviating from the substance of the disclosure which is claimed in the claims, and such modifications should not be understood separately from the technical concept or prospect of the disclosure.

What is claimed is:

1. A switching amplifier comprising:
   an input unit configured to receive an audio signal;
   a first switching element and a second switching element which are connected in series and configured to switch and output the received audio signal;
   a first regulator configured to provide by adjusting a voltage input to the first switching element so that the first switching element is not turned on in response to the second switching element being in a turn-on state; and a second regulator configured to provide by adjusting a voltage input to the second switching element so that the second switching element is not turned on in response to the first switching element being in a turn-on state, wherein each of the first switching element and the second switching element is a depletion type transistor, wherein the first regulator comprises a first power unit, the first power unit being connected to the first switching element and providing a gate of the first switching element with a first negative voltage, and wherein the second regulator comprises a second power unit, the second power unit being connected to the second switching element and providing a gate of the second switching element with a second negative voltage.

2. The switching amplifier as claimed in claim 1, wherein the input unit comprises:
a buffer configured to delay and output the received audio signal; and
an inverter configured to reverse and output the received audio signal,
wherein the first regulator comprises:
a third switching element configured to have a gate connected to an output terminal of the buffer, a drain connected to a source of the first switching element and a drain of the second switching element, and a source connected to the gate of the first switching element;
a fourth switching element configured to have a gate connected to an output terminal of the inverter and a drain connected to a source of the third switching element and the gate of the first switching element;
a first capacitor configured to have one end connected to the drain of the third switching element and the source of the first switching element, and the other end connected to a source of the fourth switching element;
a first resistor configured to have one end connected to a cathode of the first power unit; and
a first diode configured to have a cathode connected to the other end of the first resistor and an anode connected to the other end of the first capacitor and the source of the fourth switching element,
wherein the first power unit is configured to include both ends connected to the source of the first switching element.

3. The switching amplifier as claimed in claim 2, wherein the second regulator comprises:
a fifth switching element configured to have a gate connected to the output terminal of the inverter and a drain connected to the source of the second switching element;
a sixth switching element configured to have a gate connected to the output terminal of the buffer and a drain connected to the gate of the second switching element;
a second resistor configured to have one end connected to the source of the fourth switching element and the other end of the first capacitor; and
a second diode configured to, have a drain connected to the other end of the second resistor,
wherein the second power unit is configured to include an anode connected to the source of the second switching element and the drain of the fifth switching element.

4. The switching amplifier as claimed in claim 1, further comprising:
a seventh switching element and a eighth switching element configured to cut off power to the first switching element and the second switching element before a predetermined condition is satisfied in an initial driving of the switching amplifier.

5. The switching amplifier as claimed in claim 1, wherein the first switching element and the second switching element are gallium nitride (GaN) transistors.

6. The switching amplifier as claimed in claim 1, further comprising:
an LC circuit connected the first switching element and the second switching element.

7. A sound output device comprising:
a communication interface configured to receive an audio content;
an audio processor configured to divide the audio content into a plurality of audio signals;
an input unit configured to receive the divided audio signals;
a first switching element and a second switching element which are connected in series and configured to switch and output the received audio signals;
a first regulator configured to provide by adjusting a voltage input to the first switching element so that the first switching element is not turned on in response to the second switching element being in a turn-on state; and
a second regulator configured to provide by adjusting a voltage input to the second switching element so that the second switching element is not turned on in response to the first switching element being in the turn-on state,
wherein each of the first switching element and the second switching element is a depletion type transistor.

8. The sound output device as claimed in claim 7, wherein the input unit comprises:
a buffer configured to delay and output the received audio signals; and
an inverter configured to reverse and output the received audio signals, and
wherein the first regulator comprises:
a third switching element configured to have a gate connected to an output terminal of the buffer, a drain connected to a source of the first switching element and a drain of the second switching element, and a source connected to the gate of the first switching element;
a fourth switching element configured to have a gate connected to an output terminal of the inverter and a drain connected to the source of the third switching element and the gate of the first switching element;
a first capacitor configured to have one end connected to the drain of the third switching element and the source of the first switching element and the other end connected to a source of the fourth switching element;
a first resistor configured to have one end connected to a cathode of the first power unit; and
a first diode configured to have a cathode connected to the other end of the first resistor and an anode connected to the other end of the first capacitor and the source of the fourth switching element,
wherein the first power unit is configured to include both ends connected to the source of the first switching element.

9. The sound output device as claimed in claim 8, wherein the second regulator comprises:

a fifth switching element configured to have a gate connected to the output terminal of the inverter and a drain connected to the source of the second switching element;

a sixth switching element configured to have a gate connected to the output terminal of the buffer and a drain connected to the gate of the second switching element;

a second resistor configured to have one end multi-connected to the source of the fourth switching element and the other end of the first capacitor; and a second diode configured to have a drain connected to the other end of the second resistor, wherein the second power unit is configured to include an anode connected to the source of the second switching element and the drain of the fifth switching element.

10. The sound output device as claimed in claim 7, further comprising:

a seventh switching element and an eighth switching element configured to cut off power unit to the first switching element and the second switching element before a predetermined condition is satisfied in an initial driving of the switching amplifier.

11. The sound output device as claimed in claim 7, wherein the first switching element and the second switching element are gallium nitride (GaN) transistors.

12. The sound output device as claimed in claim 7, wherein each of the plurality of switching amplifiers further comprises a LC circuit connected the first switching element and the second switching element.

13. A switching amplifier comprising:

an input configured to receive a signal;

a processor configured to divide the signal into a plurality of component signals;

a plurality of regulators, each of the plurality of regulators configured to provide a voltage to a plurality of switching elements;

wherein the plurality of switching elements are arranged in pairs and configured to switch each of the plurality of component signals;

the plurality of regulators further configured so that a first switching element of a switching element pair is not turned on in response to the second switching element of a switching element pair being in a turn-on state, and the second switching element of the switching element pair is not turned on in response to the first switching element of the switching element pair being in a turn-on state; and a speaker which is provided to the plurality of component signals, wherein a first regulator comprises a first power unit, the first unit being connected to the first switching element and providing a gate of the first switching element with a negative voltage, and wherein a second regulator comprises a second power unit, the second power unit being connected to the second switching element and providing a gate of the second switching element with a negative voltage.

14. The switching amplifier as claimed in claim 13, wherein the input comprises:

a buffer configured to delay and output the received signal; and an inverter configured to reverse and output the received signal, wherein the first regulator comprises:

a third switching element configured to have a gate connected to an output terminal of the buffer, a drain connected to a source of the first switching element and a drain of the second switching element, and a source connected to the gate of the first switching element;

a fourth switching element configured to have a gate connected to an output terminal of the inverter and a drain connected to a source of the third switching element and the gate of the first switching element;

a first capacitor configured to have one end connected to the drain of the third switching element and the source of the first switching element, and the other end connected to a source of the fourth switching element;

a first resistor configured to have one end connected to a cathode of the first power unit; and a first diode configured to have a cathode connected to the other end of the first resistor and an anode connected to the other end of the first capacitor and the source of the fourth switching element, wherein the first power unit is configured to include both ends connected to the source of the first switching element.

15. The switching amplifier as claimed in claim 14, wherein the second regulator comprises:

a fifth switching element configured to have a gate connected to the output terminal of the inverter and a drain connected to the source of the second switching element;

a sixth switching element configured to have a gate connected to the output terminal of the buffer and a drain connected to the gate of the second switching element;

a second resistor configured to have one end connected to the source of the fourth switching element and the other end of the first capacitor; and a second diode configured to, have a drain connected to the other end of the second resistor, wherein the second power unit is configured to include an anode connected to the source of the second switching element and the drain of the fifth switching element.

16. The switching amplifier as claimed in claim 15 further comprising:

a seventh switching element and an eighth switching element configured to cut off power to the first switching element and the second switching element before a predetermined condition is satisfied in an initial driving of the switching amplifier.

17. The switching amplifier as claimed in claim 16, wherein the first switching element and the second switching element are gallium nitride (GaN) transistors.

18. The switching amplifier as claimed in claim 17, further comprising:

an LC circuit connected the first switching element and the second switching element.

* * * * *